(12) United States Patent
Yoshizawa (10) Patent No.: US 7,518,541 B2
(45) Date of Patent: Apr. 14, 2009

(54) MAGNETIC RESONANCE IMAGING APPARATUS AND A-D CONVERSION DEVICE

(75) Inventor: Nobuhiro Yoshizawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/765,742

(22) Filed: Jun. 20, 2007

(65) Prior Publication Data

US 2007/0296621 A1 Dec. 27, 2007

(30) Foreign Application Priority Data

Jun. 22, 2006 (JP) ............................. 2006-172521

(51) Int. Cl.
*H03M 1/12* (2006.01)
*H03M 7/16* (2006.01)
*G01R 33/34* (2006.01)

(52) U.S. Cl. ...................... 341/160; 341/98; 324/322

(58) Field of Classification Search .................. 341/97, 341/98, 158–160
See application file for complete search history.

(56) References Cited

U.S. PATENT DOCUMENTS 3,210,756 A * 10/1965 Flood ........................... 341/98

| 4,982,162 | A | | 1/1991 | Zakhor et al. | |
|---|---|---|---|---|---|
| 5,208,534 | A | * | 5/1993 | Okamoto et al. | 324/309 |
| 5,451,876 | A | | 9/1995 | Sandford et al. | |
| 6,369,572 | B1 | | 4/2002 | Van Groningen et al. | |
| 6,564,081 | B1 | * | 5/2003 | Frigo et al. | 600/410 |
| 6,624,777 | B2 | | 9/2003 | Miyano | |
| 2003/0164836 | A1 | * | 9/2003 | Tang et al. | 345/558 |
| 2005/0146455 | A1 | * | 7/2005 | Scholtens | 341/160 |

FOREIGN PATENT DOCUMENTS

JP 06097832 4/1994
JP 2002353812 A 12/2002

* cited by examiner

*Primary Examiner*—Howard Williams
(74) *Attorney, Agent, or Firm*—Armstrong Teasdale LLP (57) ABSTRACT

With the aim of reducing noise due to a digital signal in an A-D conversion unit, the following is implemented: an input unit is provided with four A-D converters and a gray code conversion unit. An analog NMR signal corresponding to each channel is inputted to each A-D converter, and the gray code conversion unit converts a digital signal represented in binary code, outputted from the A-D converters, into a digital signal represented in gray code. A gray code-converted digital signal is transferred to an output unit through a digital signal bus. The gray code digital signal is returned to a binary digital signal by a gray code inverse conversion unit, and then the output unit transmits a binary signal, outputted from the gray code inverse conversion unit, to a signal processing unit.

20 Claims, 5 Drawing Sheets

|  | 255 | 256 |
|---|---|---|
| Binary number | 01111111 | 10000000 |
| Gray code | 01000000 | 11000000 |

MAGNETIC RESONANCE IMAGING APPARATUS AND A-D CONVERSION DEVICE

CROSS REFERENCE TO RELATED APPLICATIONS

This application claims the benefit of Japanese application No. 2006-172521 filed Jun. 22, 2006, which is incorporated herein by reference.

BACKGROUND OF THE INVENTION

The present invention relates to a magnetic resonance imaging apparatus and an A-D conversion device wherein an NMR signal acquired by scanning an object to be examined is subjected to analog-digital conversion.

In recent years, MRI (Magnetic Resonance Imaging) apparatus utilizing a magnetic resonance phenomenon has been in wide spread use, and has been extensively used as a technique indispensable to diagnostic imaging of organs in living bodies.

The RF receiver unit (A-D conversion unit) of an MRI apparatus receives an NMR signal (Nuclear Magnetic Resonance signal) from an object to be examined, subjects it to A-D conversion, and outputs the obtained signal to a computer (signal processing unit). As described in Patent Document 1, for example, such an RF receiver unit is often constructed separately from a signal processing unit so that it can be expanded so as to enable the reception of multichannel incoming data.

[Patent Document 1] Japanese Unexamined Patent Publication No. 2002-353812

An MRI apparatus is constructed of: a scan unit that receives an analog NMR (Nuclear Magnetic Resonance) signal from an object to be examined; and a signal processing unit that carries out signal processing. Since the scan unit is placed in a high-magnetic-field environment, the scan unit and the signal processing unit are often installed separately from each other from the viewpoint of protection of the signal processing unit against a magnetic field and other like viewpoints. For example, they are often placed in different rooms.

An A-D (Analog-Digital) conversion device is provided which converts an analog NMR signal received by the scan unit into a digital signal, and a converted digital signal is transmitted to a signal reception unit. Receiving digital signal, the signal processing unit carries out signal processing, such as digital filtering, and then composes an image.

The A-D conversion device includes a portion (referred to as input unit) that is inputted with a signal from the scan unit and carries out A-D conversion and a portion (referred to as output unit) that outputs a digital signal to the signal processing unit. These portions are often disposed separately from each other, for example, placed on different boards. This is because in cases where they are disposed on one board, an analog signal and a digital signal coexist on the one board and this increases noise.

The input unit and the output unit are connected with each other through a bus for digital signals. As mentioned above, the input unit and the output unit are often installed away from each other, and the bus as the wiring for signals is inevitably longer than in cases where devices are connected together within one board. This brings the following disadvantage: noise may be produced depending on how a digital signal fluctuates on the bus, and this noise can get mixed in an analog signal and have great influence on the quality of an image. Especially, when the absolute value of an original NMR signal is small, noise caused by the fluctuation of digital signal poses a problem. Images generated by the signal processing unit are greatly influenced by the noise.

SUMMARY OF THE INVENTION

It is desirable that the problem described previously is solved.

In a first aspect of the invention, a magnetic resonance imaging apparatus of the invention includes: a scan unit that scans an object to be examined to acquire an analog NMR signal; an A-D conversion unit that converts an analog NMR signal acquired by the scan unit into a digital signal represented in binary notation; and a signal processing unit that generates an MR image based on a digital signal represented in binary notation converted by the A-D conversion unit. The A-D conversion unit includes: an input unit that converts an analog NMR signal inputted from the scan unit into a digital signal represented in binary notation and further converts the digital signal represented in binary notation into a gray code-converted digital signal; an output unit that inversely converts the gray-coded digital signal converted by the input unit into a digital signal represented in binary notation and outputs it to the signal processing unit; and a digital signal bus that connects the input unit and the output unit.

In a second aspect of the invention, an A-D conversion device includes: an input unit that converts an analog NMR signal into a digital signal represented in binary notation and further converts the digital signal represented in binary notation into a gray code-converted digital signal; an output unit that inversely converts the gray-coded digital signal converted by the input unit into a digital signal represented in binary notation and outputs it; and a digital signal bus that connects the input unit and the output unit.

According to the invention, a magnetic resonance imaging apparatus and an A-D conversion device wherein noise due to a digital signal is reduced within an A-D conversion unit can be provided.

Further objects and advantages of the present invention will be apparent from the following description of the preferred embodiments of the invention as illustrated in the accompanying drawings.

BRIEF DESCRIPTION OF THE DRAWINGS

FIGS. 5(*a*) and 5(*b*) are conceptual diagrams of digital signals inputted to a digital signal bus 32.

DETAILED DESCRIPTION OF THE INVENTION

Hereafter, description will be given to an MRI apparatus in an embodiment.

Figure 1:
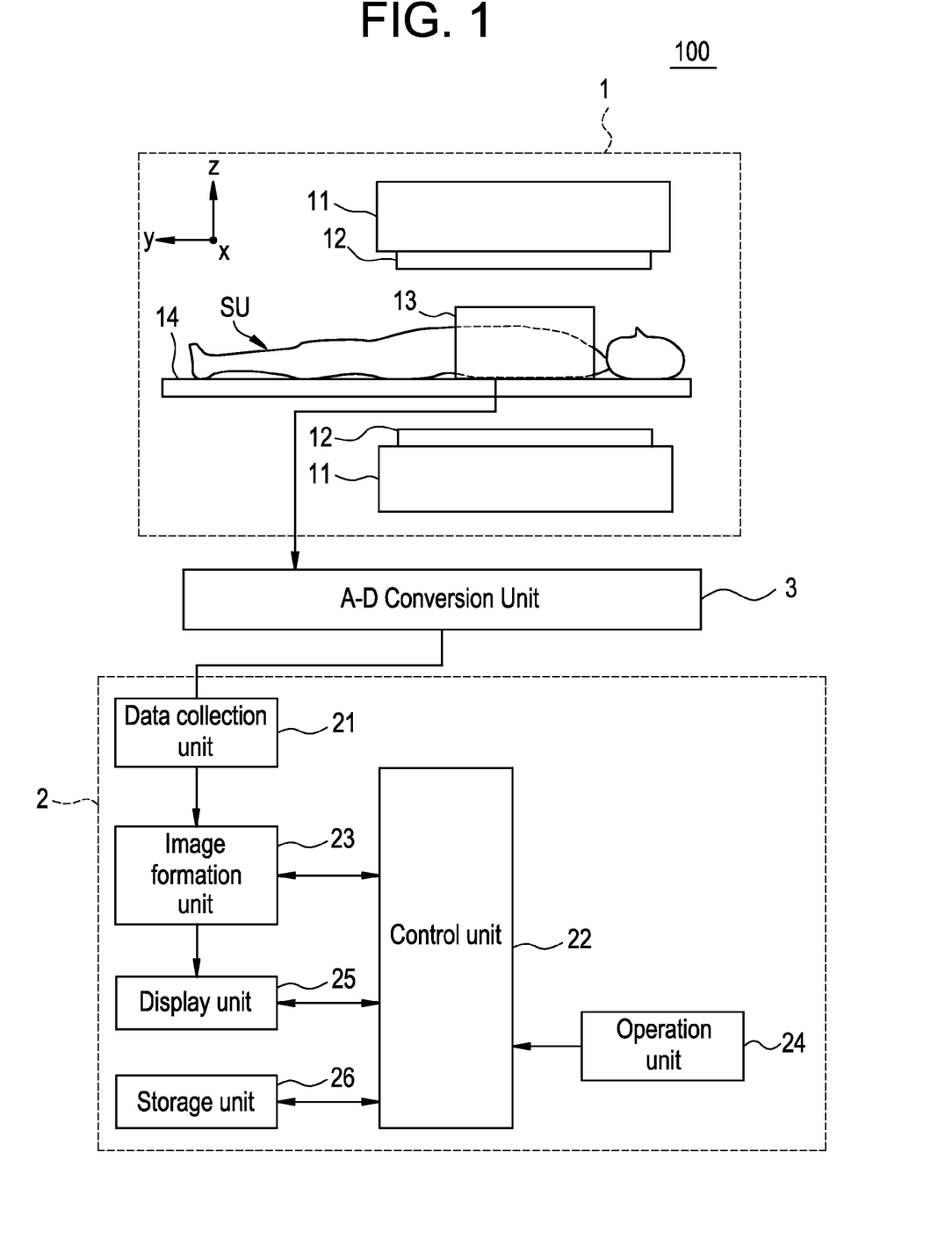
FIG. 1 is a block diagram illustrating the configuration of an MRI apparatus 100.

FIG. 1 is a block diagram illustrating the configuration of the MRI apparatus 100.

As illustrated in FIG. 1, the MRI apparatus 100 includes a scan unit 1, a signal processing unit 2, and an A-D conversion unit 3.

Description will be given to the scan unit 1.

As illustrated in FIG. 1, the scan unit 1 includes a static magnetic field magnet unit 11, a gradient coil unit 12, an RF coil unit 13, and a table 14. Scanning is carried out in an imaging space in which a static magnetic field is formed, by taking the following procedure: an object SU to be examined is irradiated with an electromagnetic wave so as to excite an imaging region of the object SU to be examined; and an NMR signal produced in the imaging region of the object SU to be examined is acquired.

Description will be sequentially given to the components of the scan unit 1.

The static magnetic field magnet unit 11 is constructed of, for example, a superconducting magnet, and forms a static magnetic field in an imaging space in which an object SU to be examined is placed. In this example, the static magnetic field magnet unit 11 forms a static magnetic field so that the direction of the static magnetic field is aligned with the direction z along the direction of the body axis of the object SU to be examined. The static magnetic field magnet unit 11 may be constructed of a permanent magnet.

The gradient coil unit 12 forms a gradient field in the imaging space with the static magnetic field formed therein, and adds spatial position information to an NMR signal received by the RF coil unit 13. In this example, the gradient coil unit 12 is composed of three systems in the x direction, y direction, and z direction. It respectively forms a gradient field in the frequency encoding direction, phase encoding direction, and slice selecting direction according to imaging conditions. Specifically, the gradient coil unit 12 applies a gradient field to the object SU to be examined in the slice selecting direction and the RF coil unit 13 transmits an RF pulse, and a slice of the object SU to be examined to be excited is thereby selected. The gradient coil unit 12 applies a gradient field to the object SU to be examined in the phase encoding direction, and subjects an NMR signal from a slice excited by an RF pulse to phase encoding. The gradient coil unit 12 applies a gradient field to the object SU to be examined in the frequency encoding direction, and subjects an NMR signal from a slice excited by an RF pulse to frequency encoding.

The RF coil unit 13 is so disposed that an imaging region of an object SU to be examined is embraced therewith. The RF coil unit 13 transmits an RF pulse as an electromagnetic wave to the object SU to be examined in the imaging space where a static magnetic field is formed by the static magnetic field magnet unit 11 to form a high-frequency magnetic field there. Thus, the RF coil unit excites a proton spin in the imaging region of the object SU to be examined. Then, the RF coil unit 13 receives an electromagnetic wave, produced from the excited proton in the object SU to be examined, as an NMR signal.

In this embodiment, the RF coil unit 13 has four channels, for example.

The table 14 has a platform on which an object SU to be examined is placed.

Description will be given to the signal processing unit 2.

As illustrated in FIG. 1, the signal processing unit 2 includes a data collection unit 21, a control unit 22, an image formation unit 23, an operation unit 24, a display unit 25, and a storage unit 26.

Description will be sequentially given to the components of the signal processing unit 2.

The data collection unit 21 collects digital signals from an A-D conversion unit 3 described later, and passes them to the image formation unit 23.

The control unit 22 includes a computer and a program for causing each part to perform operation corresponding to a predetermined scan using the computer, and controls each part. In this example, the control unit 22 is inputted with operation data from the operation unit 24, and outputs control signals to and controls each part based on operation data inputted from the operation unit 24.

The control unit 22 transmits various control signals to the scan unit 1 through the A-D conversion unit described later.

The image formation unit 23 includes a computer and a program for carrying out predetermined data processing using the computer. It reconstructs a slice image with respect to a slice of an object SU to be examined using an NMR signal from the object SU to be examined according to a control signal from the control unit 22. Then, the image formation unit 23 outputs the generated image to the display unit 25.

The operation unit 24 is constructed of an operating device such as keyboard and pointing device. The operation unit 24 receives operation data inputted by an operator, and outputs the operation data to the control unit 22.

The display unit 25 is constructed of a display device such as CRT, and displays an image on a display screen based on a control signal from the control unit 22. For example, the display unit 25 displays multiple images on the display screen with respect to an input item about which operation data is inputted to the operation unit 24 by an operator. The display unit 25 receives data about an slice image of an object SU to be examined, generated based on an NMR signal from the object SU to be examined, from the image formation unit 23, and displays this slice image on the display screen.

The storage unit 26 is constructed of a memory, and stores varied data. Data stored in the storage unit 26 is accessed by the control unit 22 as required.

Description will be given to the A-D conversion unit 3.

The A-D conversion unit 3 converts an analog NMR signal, acquired by the RF coil unit 13 of the scan unit, into a digital signal, and transfers it to the signal processing unit 2. Further, it transfers various control signals from the signal processing unit 2 to the corresponding parts of the scan unit 1.

Figure 2:
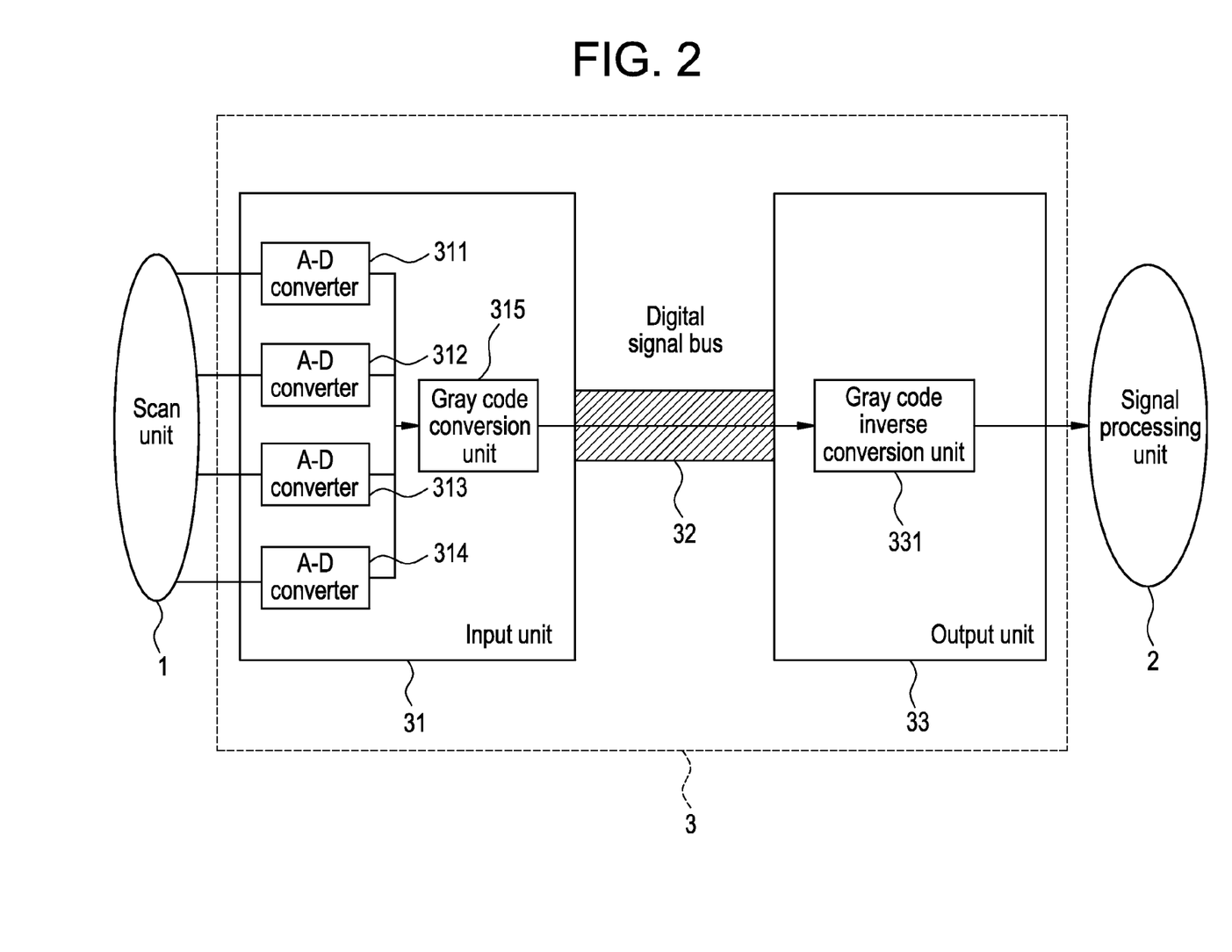
FIG. 2 is a block diagram of an A-D conversion unit 3.

FIG. 2 is a block diagram of the A-D conversion unit 3.

With respect to the A-D conversion unit in this embodiment, description will be given taking as an example a case where four-channel NMR signals are inputted.

As illustrated in FIG. 2, the A-D conversion unit 3 includes an input unit 31, a digital signal bus 32, and an output unit 33.

The A-D conversion unit 3 is disposed between the scan unit 1 and the signal processing unit 2 of the MRI apparatus, and subjects an NMR signal inputted from the scan unit 1 to analog-digital conversion and inputs the obtained signal to the signal processing unit 2.

The input unit 31 and output unit 33 of the A-D conversion unit 3 in this embodiment are separately constructed, for example, they are placed on different boards.

The input unit 31 includes four A-D converters 311, 312, 313, and 314 and a gray code conversion unit 315.

The A-D converters 311, 312, 313, and 314 are inputted with analog NMR signals through the channels of the RF coil unit 13 of the scan unit corresponding to the individual channels. In this embodiment, each of the A-D converters 311, 312, 313, and 314 digitizes an analog NMR signal, and outputs, for example, a 16-bit digital signal.

The gray code conversion unit 315 converts a digital signal represented in binary notation, outputted from the A-D converters 311, 312, 313, and 314, into a 16-bit gray-coded digital signal.

Gray code is one of coding methods for natural numbers. It has such a characteristic that when a number represented by a code is increased or decreased by one, the code is changed only at one bit.

Figure 3:
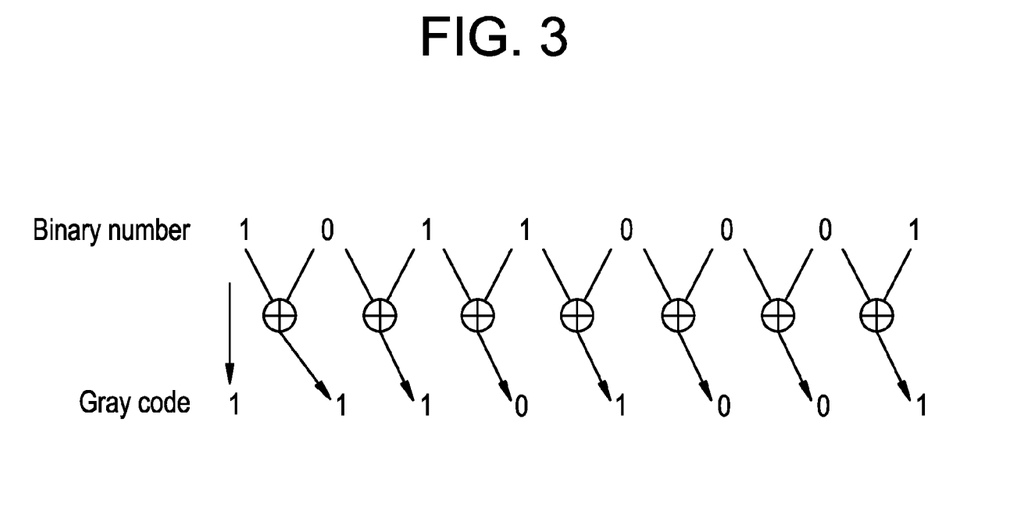
FIG. 3 is a drawing for explaining a method for converting a binary number into a gray code.

To convert a binary number into a gray code, a bit and the adjacent higher-order bit are XORed sequentially from the lowest-order bit, as illustrated in FIG. 3.

FIG. 3 is a drawing illustrating how a binary number is converted into a gray code with a case where a binary number of "10110001" is converted into a gray code taken as an example.

As illustrated in FIG. 3, 0 is outputted for gray code when adjacent two digits of a binary number are identical with each other; and 1 is outputted when they are different from each other.

As mentioned above, when a number represented by a code is increased or decreased by one, only one bit is changed in gray code. As an example of this, FIG. 4 shows the result of operation in which decimal numbers of "255" and "256" are converted into binary code and gray code.

Figure 4:
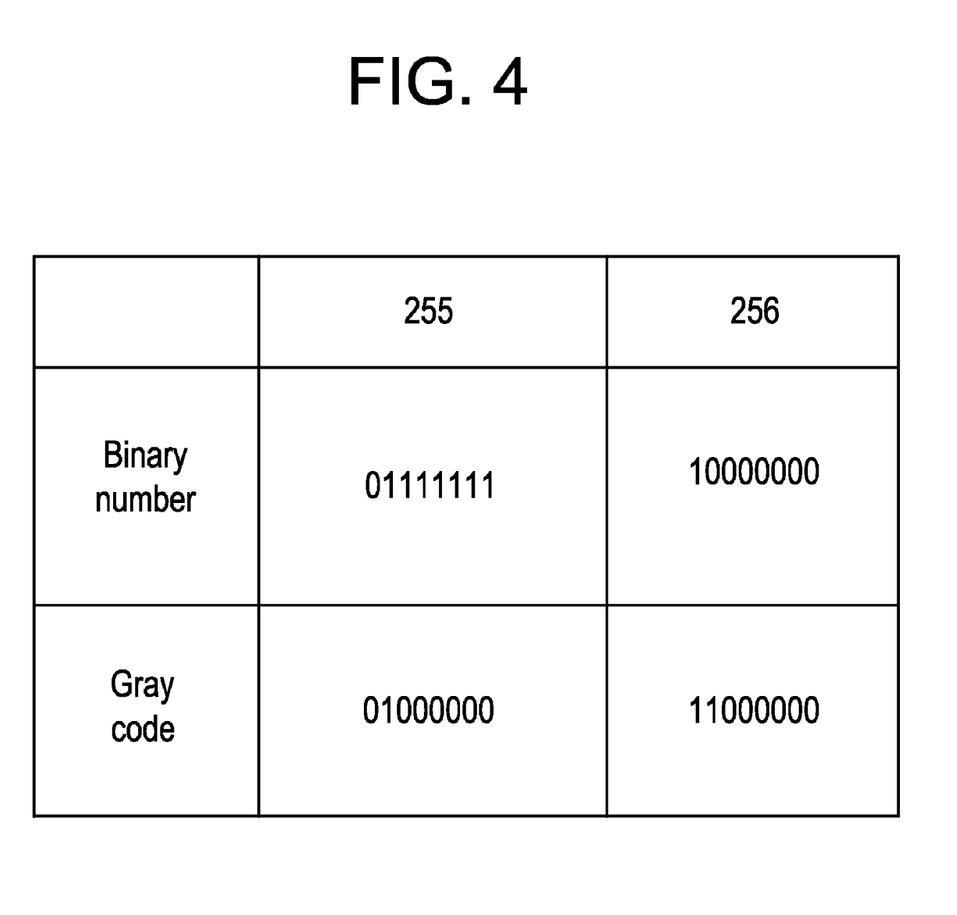
FIG. 4 is a drawing illustrating how decimal numbers of "255" and "256" are represented in binary notation and in gray code.

As illustrated in FIG. 4, while all the bits are changed in binary notation, only the highest-order bit is changed in gray code.

The gray code conversion unit 315 converts a 16-bit binary digital signal into a 16-bit gray code digital signal by the above-mentioned method and outputs it.

The digital signal bus 32 is a bus that connects the gray code conversion unit 315 and a gray code inverse conversion unit 331 described later. It is used to transmit a digital signal, outputted from the gray code conversion unit 315, to the gray code inverse conversion unit 331.

This embodiment is so constructed that the input unit 31 and the output unit 32 are separated from each other, as mentioned above. In this embodiment, therefore, the digital signal bus 32 is longer than in cases where the input unit 31 and the output unit 32 are connected with each other within one board.

The digital signal bus 32 in this embodiment has 16 signal lines in order to transmit 16-bit digital signals. The digital signal bus 32 changes the potential in the signal lines, and thereby transmits digital signals. In this embodiment, a 16-bit digital signal converted into a gray code is transmitted through the digital signal bus 32. Therefore, when a transmitted digital signal is changed by one, the number of signal lines whose potential is changed is one without exception because of the characteristic of gray code.

Detailed description will be given later to change in the potential of each signal line of the digital signal bus 32.

The digital signal bus 32 transmits digital signals equivalent to four channels in a time-shared manner, for example. That is, a digital signal converted and outputted by the A-D converter 311, for example, is transmitted only for a predetermined time, and then a signal outputted by the A-D converter 312 is transmitted for a predetermined time. Further, a signal outputted by the A-D converter 313 and a signal outputted by the A-D converter 314 are respectively transmitted only for a predetermined time. Then, a signal at the next point of time outputted by the A-D converter 311 is transmitted. Thus, transmitted data is changed to a signal on the next channel at predetermined time intervals.

In the invention, there is no limitation on the predetermined time intervals.

The output unit 33 includes the gray code inverse conversion unit 331.

The gray code inverse conversion unit 331 returns a 16-bit gray-coded digital signal, transmitted through the digital signal bus 32, into a 16-bit digital signal represented in binary notation. That is, with respect to an inputted gray code signal, a bit and the adjacent higher-order bit are XORed sequentially from the highest-order bit.

The output unit 33 outputs a binary digital signal, converted by the gray code inverse conversion unit 331, to the data collection unit 21 of the signal processing unit 2.

Hereafter, detailed description will be given to change in the potential of the signal lines of the digital signal bus 32 with respect to cases where a binary digital signal is inputted and cases where a gray code digital signal is inputted. The description given here is on the assumption that "0" and "−1" (decimal notation) are alternately inputted at predetermined time intervals.

"0" in decimal notation is equivalent to "0000000000000000" in 16-bit binary notation. It is equivalent to "0000000000000000" in gray code as well.

"−1" in decimal notation is equivalent to "1111111111111111" in 16-bit binary notion using the complement representation of 2. The complement representation of 2 is representation used to represent negative numbers in commonly used computers. It is represented as "1000000000000000" in gray code.

More specific description will be given. In cases where 16-bit digital signals in binary notation are inputted to the digital signal bus 32, "0000000000000000" and "1111111111111111" are alternately inputted at predetermined time intervals as illustrated in FIG. 5(a).

Figure 5A:
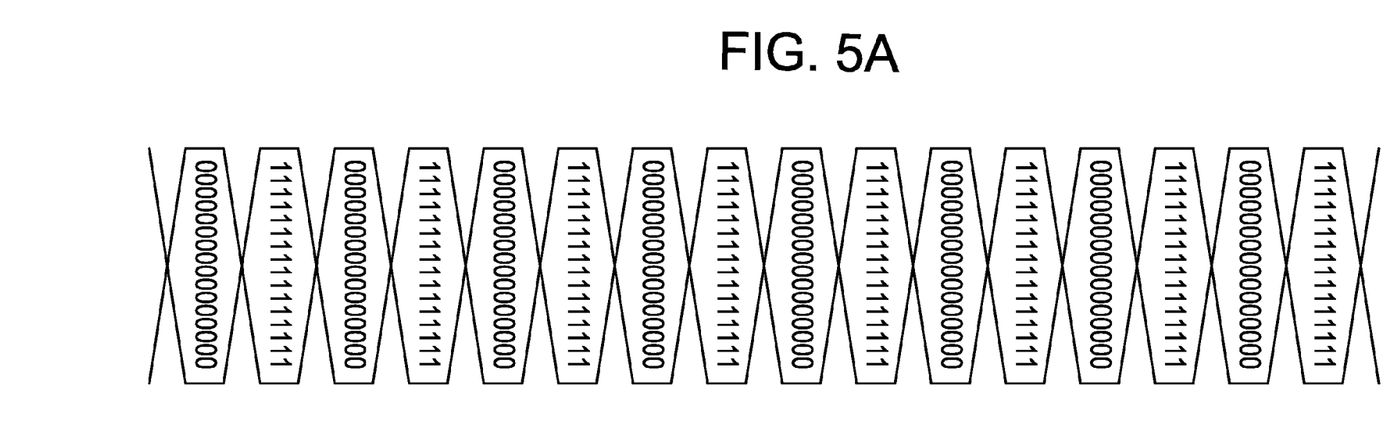
Figure 5B:
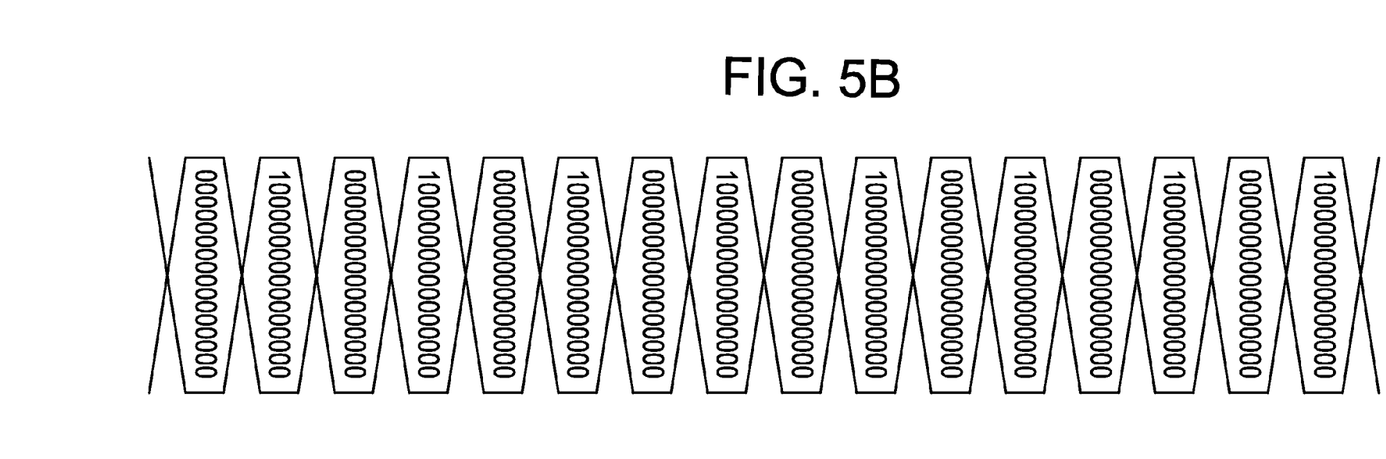

FIG. 5 are conceptual diagrams of digital signals inputted to the digital signal bus 32, and the digital signals are sequentially inputted from the left.

In binary digital signals transmitted through the digital signal bus 32 in these cases, the 16 bits are all changed each time a predetermined time has passed. In all the 16 signal lines of the digital signal bus 32, the potential is changed each time a predetermined time has passed, and this can cause noise mixed in analog signals.

Meanwhile, in cases where 16-bit gray code digital signals are inputted to the digital signal bus 32, "0000000000000000" and "1000000000000000" are alternately inputted at predetermined time intervals as illustrated in FIG. 5(b).

In digital signals transmitted through the digital signal bus 32 in these cases, only the first bit of the 16 signal lines is changed each time a predetermined time has passed, and the other bits remain unchanged.

Thus, in gray code digital signals transmitted through the digital signal bus 32, only the first bit is changed each time a predetermined time has passed. Therefore, only one of the 16 signal lines of the digital signal bus 32 is changed at predetermined time intervals. As a result, noise due to change in the potential of the signal lines of the digital signal bus 32 is significantly reduced as compared with the above-mentioned cases where binary digital signals are transmitted.

Here, description has been given to cases where "0" and "−1" (decimal notation) are alternately inputted, as an example. The reason for this is as follows: when the absolute value of an inputted digital signal is small, especially, digital noise due to fluctuation in the potential of a signal line is troublesome.

When the absolute value of an inputted digital signal is small, that is, when the value of an inputted digital signal is "−1 to 1" or so, digital signals transmitted through the digital bus 32 fluctuate substantially by one. In gray code digital signals in this case, the number of signal lines whose potential is changed is one; therefore, produced noise can be suppressed and minimized.

As described up to this point, the following is implemented in the MRI apparatus 100 in this embodiment when scan data (analog signal) obtained by scanning an object to be examined with the scan unit 1 is A-D-converted and transmitted to the signal processing unit 2: a digital signal represented in binary notation, converted from analog to digital and outputted by the A-D converters 311 to 314 of the A-D conversion unit 3, is converted into a gray code digital signal by the gray code conversion unit 315, and then transferred to the output unit 33 through the digital signal bus 32; the gray code digital signal is returned to a binary digital signal by the gray code inverse conversion unit 331 of the output unit 33, and then transmitted to the signal processing unit 2. When a digital signal is transferred in the A-D conversion unit 3, it is transferred in the form of gray code digital signal that does not fluctuate so much. Therefore, when the absolution value of a digital signal transmitted through the digital signal bus 32 is small, the number of signal lines that change from channel to channel on the digital signal bus 32 is small, and the potential of the entire digital signal bus does not change so much. As a result, noise that gets mixed in an analog signal due to change in potential when a digital signal is transferred can be suppressed and minimized.

In the MRI apparatus 100 in this embodiment, the conversion processing carried out by the gray code conversion unit 315 and the gray code inverse conversion unit 331 can be easily performed by software. Therefore, the above mentioned effect of minimizing mixed noise can be obtained without increase in circuit scale or cost. The gray code conversion unit 315 and the gray code inverse conversion unit 331 may be provided as hardware in the A-D conversion unit 3, needless to add. Also, in this case, the effect of minimizing mixed noise can be obtained.

The invention is not limited to the above-mentioned embodiment.

That is, when the invention is embodied, the components of the above-mentioned embodiment can be modified, combined, subsidiarily combined, and substituted in various manners without departing from the technical scope of the invention or the scope equivalent thereto.

The description of the above-mentioned embodiment has been given to a case where the A-D conversion unit 3 has four channels. The invention is not limited to this, and the A-D conversion unit may have any channels other than four channels. The description of the above-mentioned embodiment has been given to a case where when digital signals are transferred from the input unit 31 to the output unit 33 through the digital signal bus 32, the digital signals on each channel are transferred in a time-shared manner. The invention is not limited to this. For example, a digital signal obtained by converting an NMR signal on a specific channel may be transmitted through the digital signal bus 32 at predetermined time intervals. In the above-mentioned embodiment, the digital signals converted by the A-D converters 311 to 314 are of 16 bits. The invention is not limited to this. Signals may be converted into 8-bit or 32-bit digital signals. In this case, the digital signal bus 32 is provided with signal lines in the same number as the number of bits converted by the A-D converters 311 to 314.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
a scan unit configured to scan an object to be examined and acquire an analog nuclear magnetic resonance (NMR) signal;
an analog-to-digital (A-D) conversion unit configured to convert the analog NMR signal into a first digital signal represented in binary notation; and
a signal processing unit configured to generate a magnetic resonance (MR) image based on a second digital signal represented in binary notation, said A-D conversion unit comprising:
an input unit configured to convert the analog NMR signal inputted from said scan unit into the first digital signal represented in binary notation, and convert the first digital signal represented in binary notation into a gray code-converted digital signal; and
an output unit configured to inversely convert the gray-coded digital signal into a second digital signal represented in binary notation, and output the second digital signal to said signal processing unit, said input unit and said output unit coupled by a digital signal bus configured to transmit the gray-coded digital signal in a time-shared manner between said input unit and said output unit.

2. The magnetic resonance imaging apparatus according to claim 1, wherein said input unit comprises:
an A-D converter configured to convert the analog NMR signal into the first digital signal represented in binary notation; and
a gray code conversion unit configured to convert the first digital signal represented in binary notation into the gray-coded digital signal, and wherein said the output unit comprises:
a gray code inverse conversion unit configured to inversely convert the gray-coded digital signal into the second digital signal represented in binary notation.

3. The magnetic resonance imaging apparatus according to claim 2, wherein a gray code used by said gray code conversion unit is characterized in that when a number represented by a coded word is one of increased by one and decreased by one, the coded word is changed only at one bit.

4. The magnetic resonance imaging apparatus according to claim 3, wherein said A-D conversion unit further comprises a number of A-D converters that corresponds to a number of channels of said scan unit.

5. The magnetic resonance imaging apparatus according to claim 2, wherein said A-D conversion unit further comprises a number of A-D converters that corresponds to a number of channels of said scan unit.

6. The magnetic resonance imaging apparatus according to claim 1, wherein said input unit comprises a gray code conversion unit configured to convert the first digital signal represented in binary notation into the gray-coded digital signal using a gray code that is characterized in that when a number represented by a coded word is one of increased by one and decreased by one, the coded word is changed only at one bit.

7. The magnetic resonance imaging apparatus according to claim 6, wherein said A-D conversion unit further comprises a number of A-D converters that corresponds to a number of channels of said scan unit.

8. The magnetic resonance imaging apparatus according to claim 1 wherein said A-D conversion unit further comprises a number of A-D converters that corresponds to a number of channels of said scan unit.

9. The magnetic resonance imaging apparatus according to claim 1, the first digital signal represented in binary notation and the second digital signal represented in binary notation are 16-bit digital signals.

10. The magnetic resonance imaging apparatus according to claim 1, wherein said scan unit comprises four channels.

11. An analog-to-digital (A-D) conversion device comprising:
   an input unit configured to convert an analog nuclear magnetic resonance (NMR) signal into a first digital signal represented in binary notation, and to convert the first digital signal represented in binary notation into a gray code-converted digital signal; and
   an output unit coupled to said input unit by a digital signal bus, said output unit configured to inversely convert the gray-coded digital signal into a second digital signal represented in binary notation and to output the second digital signal represented in binary notation, said digital signal bus configured to transmit the gray-coded digital signal in a time-shared manner between said input unit and said output unit.

12. The analog-to-digital (A-D) conversion device according to claim 11, wherein said input unit comprises:
   an A-D converter an configured to convert the analog NMR signal into the first digital signal represented in binary notation; and
   a gray code conversion unit configured to convert the first digital signal represented in binary notation into the gray-coded digital signal, and wherein said output unit comprises:
   a gray code inverse conversion unit configured to inversely convert the gray-coded digital signal into the second digital signal represented in binary notation.

13. The analog-to-digital (A-D) conversion device according to claim 12, wherein a the gray code used by said gray code conversion unit is characterized in that when a number represented by a coded word is one of increased by one and decreased by one, the coded word is changed only at one bit.

14. The analog-to-digital (A-D) conversion device according to claim 11, wherein said input unit comprises a gray code conversion unit configured to convert the first digital signal represented in binary notation into the gray-coded digital signal using a gray code that is characterized in that when a number represented by a coded word is one of increased by one and decreased by one, the coded word is changed only at one bit.

15. The analog-to-digital (A-D) conversion device according to claim 11, wherein the analog NMR signal is acquired by a scan unit of a magnetic resonance imaging apparatus coupled to said A-D conversion device.

16. A method of analog-to-digital (A-D) conversion comprising:
   converting an analog nuclear magnetic resonance (NMR) signal into a first digital signal represented in binary notation using an input unit;
   converting the first digital signal represented in binary notation into a gray code-converted digital signal using the input unit;
   transmitting the gray-coded digital signal from the input unit to an output unit through a digital signal bus in a time-shared manner;
   inversely converting the gray-coded digital signal into a second digital signal represented in binary notation using the output unit; and
   outputting the second digital signal through the output unit.

17. The method according to claim 16, wherein:
   converting an analog NMR signal into a first digital signal represented in binary notation using an input unit further comprises converting the analog NMR signal into the first digital signal represented in binary notation using an A-D converter; and
   converting the first digital signal represented in binary notation into a gray code-converted digital signal using the input unit further comprises converting the first digital signal represented in binary notation into the gray-coded digital signal using a gray code conversion unit.

18. The method according to claim 16, wherein inversely converting the gray-coded digital signal into a second digital signal represented in binary notation using the output unit further comprises inversely converting the gray-coded digital signal into the second digital signal represented in binary notation using a gray code inverse conversion unit.

19. The method according to claim 16, wherein converting the first digital signal represented in binary notation into a gray-coded digital signal further comprises converting the first digital signal represented in binary notation into the gray-coded digital signal based on a gray code in which only one bit is changed when a number represented by a coded word is one of increased by one and decreased by one.

20. The method according to claim 16, wherein converting an analog NMR signal into a first digital signal represented in binary notation using an input unit further comprises converting an analog NMR signal acquired by a scan unit of a magnetic resonance imaging apparatus, the scan unit coupled to an A-D conversion device that includes the input unit and the output unit.

* * * * *